US010957606B2

(12) United States Patent
Chen et al.

(10) Patent No.: US 10,957,606 B2
(45) Date of Patent: Mar. 23, 2021

(54) MANUFACTURING METHOD OF COMPLEMENTARY METAL OXIDE SEMICONDUCTOR TRANSISTOR AND MANUFACTURING METHOD OF ARRAY SUBSTRATE

(71) Applicant: Wuhan China Star Optoelectronics Technology Co., Ltd., Hubei (CN)

(72) Inventors: Yuxia Chen, Hubei (CN); Chao He, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 280 days.

(21) Appl. No.: 16/096,871

(22) PCT Filed: Apr. 20, 2018

(86) PCT No.: PCT/CN2018/083881
§ 371 (c)(1),
(2) Date: Oct. 26, 2018

(87) PCT Pub. No.: WO2019/184026
PCT Pub. Date: Oct. 3, 2019

(65) Prior Publication Data
US 2020/0357702 A1 Nov. 12, 2020

(30) Foreign Application Priority Data
Mar. 30, 2018 (CN) .......................... 201810297124.9

(51) Int. Cl.
*H01L 21/00* (2006.01)
*H01L 21/8238* (2006.01)
*H01L 21/02* (2006.01)

(52) U.S. Cl.
CPC ............... *H01L 21/823807* (2013.01); *H01L 21/02675* (2013.01); *H01L 21/823814* (2013.01)

(58) Field of Classification Search
CPC ....... H01L 21/02675; H01L 21/823807; H01L 21/823814; H01L 27/1259; H01L 27/1288; H01L 29/78633; H01L 29/4908
(Continued)

(56) References Cited

U.S. PATENT DOCUMENTS

2013/0071963 A1* 3/2013 Choi .................... H01L 27/1255
438/34
2017/0104018 A1* 4/2017 Yamazaki ........... H01L 27/1218

FOREIGN PATENT DOCUMENTS

CN     103325840     9/2013
CN     103996655     8/2014
(Continued)

*Primary Examiner* — Brook Kebede
(74) *Attorney, Agent, or Firm* — Leong C. Lei

(57) ABSTRACT

Disclosed is a manufacturing method of a complementary metal oxide semiconductor transistor, comprising a step of implementing a channel doping to an N-type channel region. The step comprises: preparing a low temperature polysilicon layer on a substrate, and patterning the low temperature polysilicon layer to form the N-type channel region correspondingly above a light shielding pattern; coating a negative photoresist on the substrate, and using the light shielding pattern as a mask to implement exposure to the negative photoresist from a back surface of the substrate to form a negative photoresist mask plate exposing the N-type channel region after development; implementing the channel doping to the N-type channel region with shielding of the negative photoresist mask plate. Further disclosed is a manufacturing method of an array substrate, applied with the aforesaid manufacturing method of the complementary metal oxide semiconductor transistor.

17 Claims, 5 Drawing Sheets

(58) Field of Classification Search
USPC .......................................... 438/159, 160, 199
See application file for complete search history.

(56) References Cited

FOREIGN PATENT DOCUMENTS

| | | |
|---|---|---|
| CN | 105489552 | 4/2016 |
| KR | 100667080 | 1/2007 |

* cited by examiner

MANUFACTURING METHOD OF COMPLEMENTARY METAL OXIDE SEMICONDUCTOR TRANSISTOR AND MANUFACTURING METHOD OF ARRAY SUBSTRATE

RELATED APPLICATIONS

The present application is a National Phase of International Application Number PCT/CN2018/083881, filed Apr. 20, 2018, and claims the priority of China Application No. 201810297124.9 filed Mar. 30, 2018.

FIELD OF THE INVENTION

The present invention relates to a display technology field, and more particularly to a manufacturing method of a complementary metal oxide semiconductor transistor and a manufacturing method of an array substrate.

BACKGROUND OF THE INVENTION

A flat panel display possesses advantages of being ultra thin, power saved and radiation free and has been widely utilized. The existing flat panel display devices mainly include a Liquid Crystal Display (LCD) and an Organic Light Emitting Display (OLED). Thin Film transistors (TFT) are important components of a flat panel display which can be formed on a glass substrate or a plastic substrate. Generally, the thin film transistors are employed as switching elements and driving elements utilized such as LCDs and OLEDs.

In recent years, the display technology has developed rapidly. The thin film transistor technology has evolved from the original amorphous silicon (a-Si) thin film transistor to a low temperature polysilicon (LTPS) thin film transistor. The LTPS thin film transistor has many advantages. For instance, the LTPS thin film transistor has a higher electron mobility, which cannot only effectively reduce the area of the thin film transistor, increase the aperture ratio but also can reduce the overall power consumption while increasing the display luminance. Meanwhile, with the higher electron mobility, a portion of the driving circuit can be integrated on the substrate to reduce the driving integrated circuit to greatly increase the reliability of the display panel and to greatly reduce the manufacturing cost. Therefore, LTPS thin film transistors have gradually become a research hotspot in display technology.

However, due to the complexity of the LTPS process, particularly regarding Complementary Metal Oxide Semiconductor (CMOS) transistors, channel doping of NMOS (Negative Channel Metal Oxide Semiconductor) is required to provide good metal semiconductor properties.

In the prior art, referring to FIG. 1, the step of implementing a channel doping to an N-type channel region comprises:

A, as shown in FIG. 1(a), forming a N-type channel region 2 and a P-type channel region 3 on a substrate 1, wherein a light shielding pattern 4 is provided below the N-type channel region 2; coating a positive photoresist layer 5 on the substrate 1, wherein the positive photoresist layer 5 covers the N-type channel region 2 and the P-type channel region 3;

B, as shown in FIG. 1(b), disposing an exposure mask plate 6 on the positive photoresist layer 5 to expose the positive photoresist layer 5, wherein solid arrows in the figure indicate the exposure light;

C, as shown in FIG. 1(c), developing the exposed positive photoresist layer to form a positive photoresist mask 5a exposing only the N-type channel region 2; implementing the channel doping to the N-type channel region 2 with the shielding of the positive photoresist mask 5a, wherein dot arrows in the figure indicate the exposure light.

In the aforesaid step of implementing the channel doping, it is necessary to design the corresponding exposure mask for the pattern of the N-type channel region, which increases the production cost.

SUMMARY OF THE INVENTION

On this account, the present invention provides a manufacturing method of a complementary metal oxide semiconductor transistor. During the process of implementing a channel doping to an N-type channel region, there is no need to specifically design a corresponding exposure mask for the pattern of the N-type channel region. Thus, the production cost can be saved thereby.

For realizing the aforesaid objective, the skill solution utilized by the present invention is:

a manufacturing method of a complementary metal oxide semiconductor transistor, comprising a step of implementing a channel doping to an N-type channel region, wherein the step comprises:

preparing a low temperature polysilicon layer on a substrate, and patterning the low temperature polysilicon layer to form the N-type channel region correspondingly above a light shielding pattern;

coating a negative photoresist on the substrate, and using the light shielding pattern as a mask to implement exposure to the negative photoresist from a back surface of the substrate to form a negative photoresist mask plate exposing the N-type channel region after development;

implementing the channel doping to the N-type channel region with shielding of the negative photoresist mask plate.

The manufacturing method of the complementary metal oxide semiconductor transistor specifically comprises:

S101, providing the substrate, and defining a NMOS region and a PMOS region on the substrate, and forming the light shielding pattern in the NMOS region on the substrate;

S102, preparing a low temperature polysilicon layer on the substrate, and patterning the low temperature polysilicon layer to form the N-type channel region correspondingly above the light shielding pattern in the NMOS region and to form a P-type channel region in the PMOS region;

S103, implementing the channel doping to the N-type channel region;

S104, implementing an N-type heavy doping on two ends of the N-type channel region, and forming two N-type heavily doped regions in the N-type channel region;

S105, preparing a gate insulating layer on the substrate, wherein the gate insulating layer covers the N-type channel region and the P-type channel region;

S106, depositing a first metal layer on the gate insulating layer, and patterning the first metal layer to form a first gate electrode correspondingly above the N-type channel region and to form a second gate electrode correspondingly above the P-type channel region;

S107, implementing an N-type light doping to the N-type channel region with the first gate electrode as a mask, and forming two N-type lightly doped regions at inner sides of the two N-type heavily doped regions, and forming an N-type channel between the two N-type lightly doped regions in the N-type channel region;

S108, implementing a P-type heavy doping on two ends of the P-type channel region, and forming two P-type heavily doped regions in the P-type channel region, and forming a P-type channel between the two P-type heavily doped regions in the P-type channel region;

S109, preparing an interlayer insulating layer on the gate insulating layer, and patterning the interlayer insulating layer and the gate insulating layer to form first vias above the N-type heavily doped region and second vias above the P-type heavily doped regions;

S110, depositing a second metal layer on the interlayer insulating layer, and patterning the second metal layer to form a first source electrode and a first drain electrode in the NMOS region and to form a second source electrode and a second drain electrode in the PMOS region, wherein the first source electrode and the first drain electrode are respectively connected to the N-type heavily doped region through the first vias, and the second source electrode and the second drain electrode are respectively connected to the P-type heavily doped region through the second vias.

Step S102, preparing the low temperature polysilicon layer on the substrate comprises:

forming a buffer layer covering the light shielding pattern on the substrate;

depositing an amorphous silicon layer on the buffer layer and crystallizing the amorphous silicon layer by an excimer laser annealing process to obtain the low temperature polysilicon layer.

In Step S103, the channel doping is to implement a boron atom light doping to the N-type channel region by an ion implantation process.

In Step S104, the N-type heavy doping is to implant phosphorous atoms with a high concentration by an ion implantation process.

In Step S107, the N-type light doping is to implant phosphorous atoms with a low concentration by an ion implantation process.

In Step S108, the P-type heavy doping is to implant boron atoms with a high concentration by an ion implantation process.

The substrate is a glass substrate; a material of the light shielding pattern, the first metal layer and the second metal layer is molybdenum or titanium; a material of the gate insulating layer and the interlayer insulating layer is silicon oxide, silicon nitride or a combination of silicon oxide and silicon nitride.

The present invention further provides a manufacturing method of an array substrate, comprising:

forming the complementary metal oxide semiconductor transistor on the substrate according to the aforesaid manufacturing method of the complementary metal oxide semiconductor transistor;

sequentially preparing a planarization layer, a common electrode layer, a passivation layer and a pixel electrode layer on the complementary metal oxide semiconductor transistor, wherein the pixel electrode layer is electrically coupled to the complementary metal oxide semiconductor transistor.

A material of the planarization layer and the passivation layer is silicon oxide, silicon nitride or a combination of silicon oxide and silicon nitride; a material of the common electrode layer and the pixel electrode layer is indium tin oxide.

In comparison with the prior art, in the manufacturing method of the complementary metal oxide semiconductor transistor provided by the embodiment of the present invention, during the process of implementing the channel doping to the N-type channel region, the negative photoresist is utilized and the light shielding pattern below the N-type channel region is used as an exposure mask. Thus, there is no need to specifically design a corresponding exposure mask for the pattern of the N-type channel region and the production cost is saved.

DETAILED DESCRIPTION OF PREFERRED EMBODIMENTS

Figure 1:
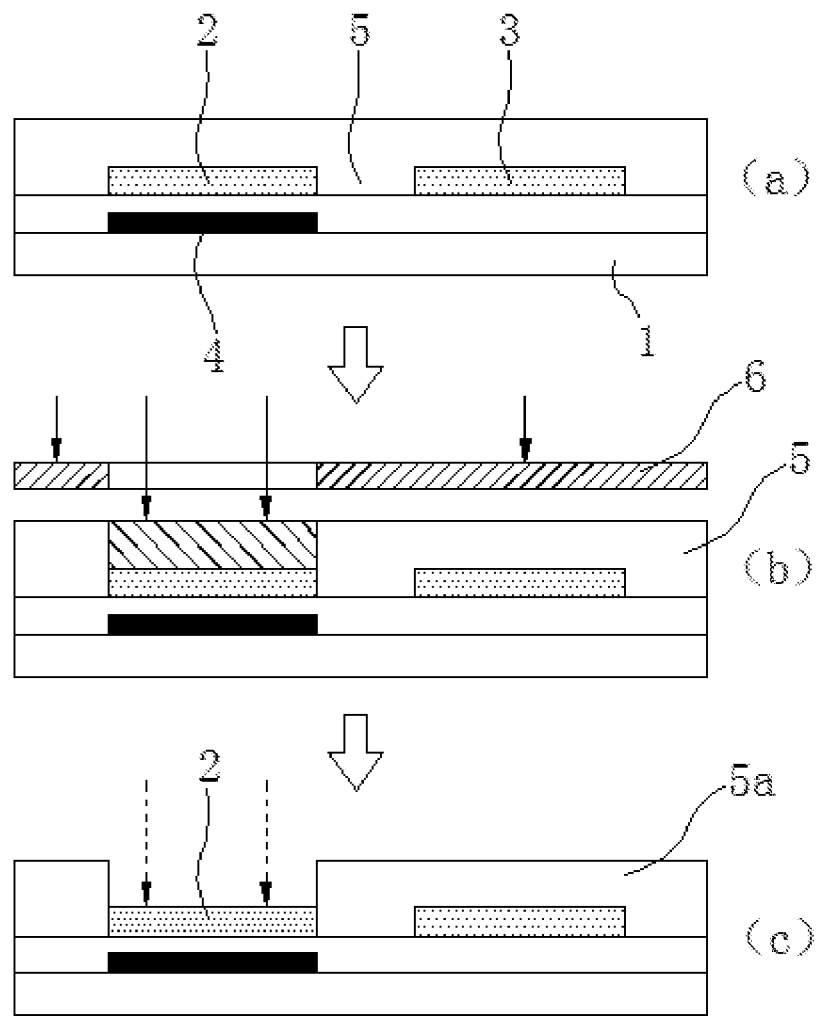
FIG. 1 is a flow chart showing a process of implementing a channel doping in an N-type channel region according to the prior art.

In order to make the objectives, technical solutions, and advantages of the embodiments of the disclosure more apparent, the specific embodiments of the present invention will be described below in detail with reference to the drawings. Examples of these preferred embodiments are illustrated in the accompanying drawings. The embodiments of the present invention shown in the drawings and described with reference to the drawings are merely exemplary, and the present invention is not limited to these embodiments.

Here, it should also be noted that, in order to avoid obscuring the present invention due to unnecessary details, only the structures and/or processing steps closely related to the solution according to the present invention are shown in the drawings, and other details that are not relevant to the present invention are omitted.

Embodiment 1

Figure 2:
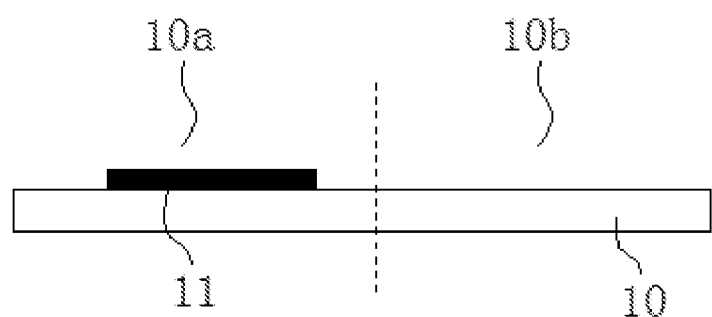
FIG. 2 to FIG. 11 are exemplary illustrative diagrams of component structures corresponding to respective process steps in a manufacturing method of a complementary metal oxide semiconductor transistor according to embodiment 1 of the present invention.

The embodiment provides a manufacturing method of a complementary metal oxide semiconductor transistor. Please refer from FIG. 2 to FIG. 11. The manufacturing method comprises:

Step S101, as shown in FIG. 2, providing a substrate 10, and defining a NMOS region 10a and a PMOS region 10b on the substrate 10, and forming a light shielding pattern 11 in the NMOS region 10a on the substrate 10. Specifically, the substrate 10 is a glass substrate. The light shielding pattern 11 is obtained with a photolithography process. A material of the light shielding pattern 11 is a metal material, which can be molybdenum (Mo) or titanium (Ti).

Figure 3:
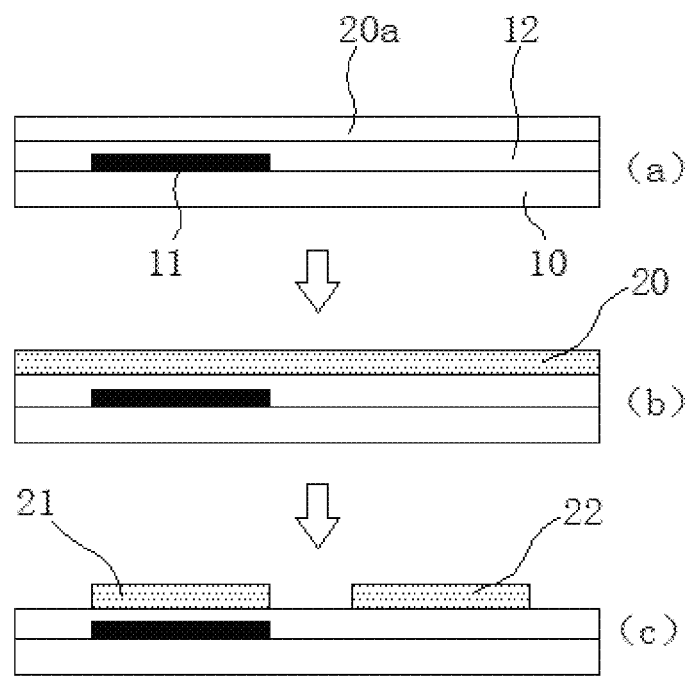

Step S102, referring to FIG. 3, preparing a low temperature polysilicon layer 20 on the substrate 10, and patterning the low temperature polysilicon layer 20 to form the N-type channel region 21 correspondingly above the light shielding pattern 11 in the NMOS region 10a and to form a P-type channel region 22 in the PMOS region 10b.

Specifically, first as shown in FIG. 3(a), forming a buffer layer 12 covering the light shielding pattern 11 on the substrate 10, and depositing an amorphous silicon layer 20a on the buffer layer 12; and then, as shown in FIG. 3(b), crystallizing the amorphous silicon layer 20a by an excimer laser annealing (ELA) process to obtain the low temperature polysilicon layer 20; furthermore as shown in FIG. 3(*c*), etching the low temperature polysilicon layer 20 to form the N-type channel region 21 and the P-type channel region 22 by photolithography process.

Figure 4:
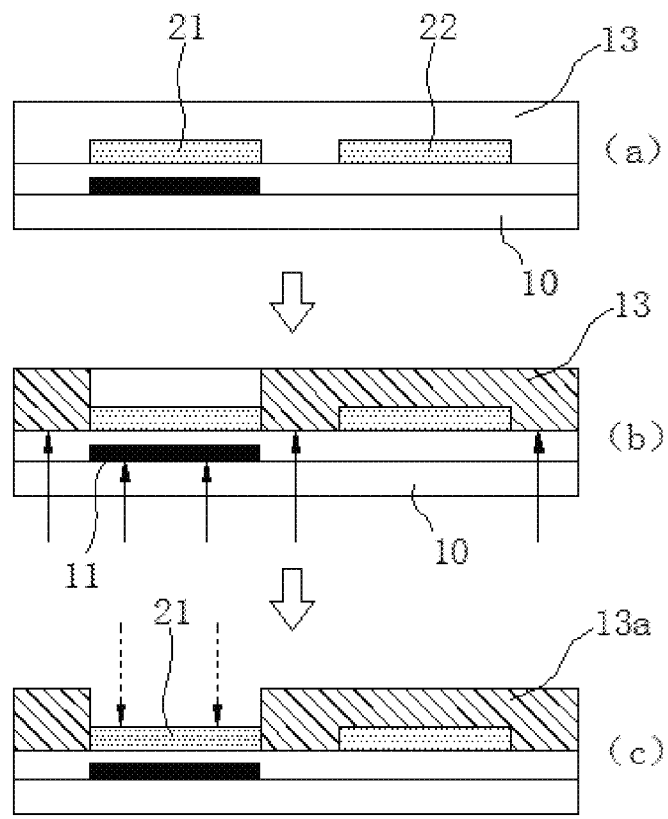

Step S103, referring to FIG. 4, implementing the channel doping to the N-type channel region 21. The step specifically comprises:

first, as shown in FIG. 4(*a*), coating a negative photoresist 13 on the substrate 10, wherein the negative photoresist 13 covers the N-type channel region 21 and the P-type channel region 22;

then, as shown in FIG. 4(*b*), using the light shielding pattern 11 as a mask to implement exposure to the negative photoresist 13 from a back surface of the substrate 10, wherein solid arrows in the figure indicate the exposure light;

and then, as shown in FIG. 4(*c*), implementing development to the negative photoresist 13 to form a negative photoresist mask plate 13*a* exposing the N-type channel region 21, and then implementing the channel doping to the N-type channel region 21 with shielding of the negative photoresist mask plate 13*a*, wherein dot arrows in the figure indicate the doping process.

The channel doping is to implement a boron atom light doping to the N-type channel region 12 by an ion implantation process. The negative photoresist mask plate 13*a* is stripped after doping is accomplished.

Figure 5:
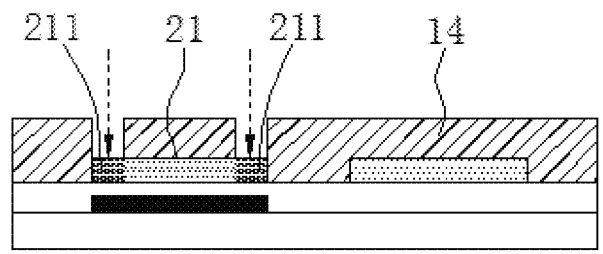

Step S104, as shown in FIG. 5, configuring a positive photoresist mask plate 14, and implementing an N-type heavy doping (dot arrows in the figure indicate the doping process) on two ends of the N-type channel region 21, and forming two N-type heavily doped regions 211 in the N-type channel region 21. The positive photoresist mask plate 14 is stripped after doping is accomplished.

The N-type heavy doping is to implant phosphorous atoms with a high concentration by an ion implantation process.

Figure 6:
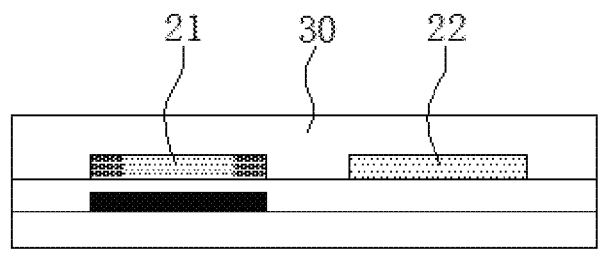

Step S105, as shown in FIG. 6, preparing a gate insulating layer 30 on the substrate 10, wherein the gate insulating layer 30 covers the N-type channel region 21 and the P-type channel region 22. A material of the gate insulating layer 30 is silicon oxide, silicon nitride or a combination of silicon oxide and silicon nitride.

Figure 7:
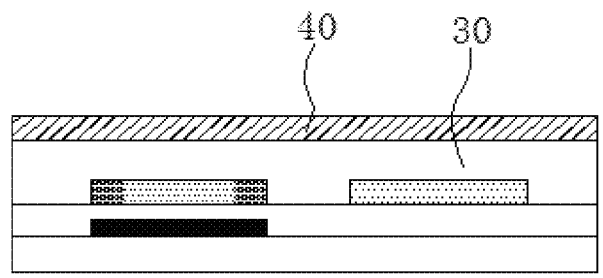
Figure 7:
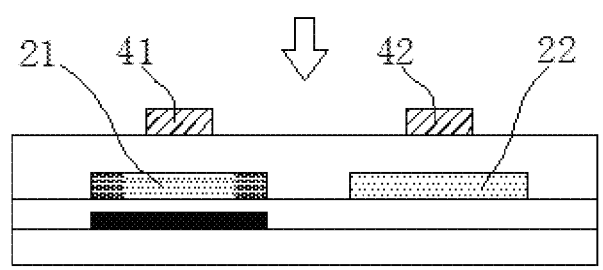

Step S106, as shown in FIG. 7, depositing a first metal layer 40 on the gate insulating layer 30, and patterning the first metal layer 40 to form a first gate electrode 41 correspondingly above the N-type channel region 21 and to form a second gate electrode 42 correspondingly above the P-type channel region 22.

A material of the first metal layer 40 can be molybdenum (Mo) or titanium (Ti).

Figure 8:
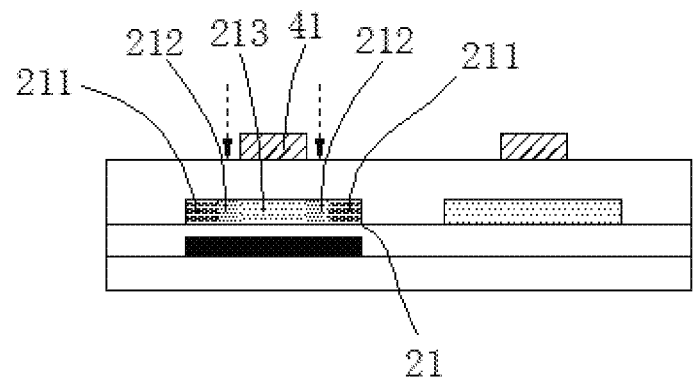

Step S107, as shown in FIG. 8, implementing an N-type light doping (dot arrows in the figure indicate the doping process) to the N-type channel region 21 with the first gate electrode 41 as a mask, and forming two N-type lightly doped regions 212 at inner sides of the two N-type heavily doped regions 211, and forming an N-type channel 213 between the two N-type lightly doped regions 212 in the N-type channel region 21.

The N-type light doping is to implant phosphorous atoms with a low concentration by an ion implantation process.

Figure 9:
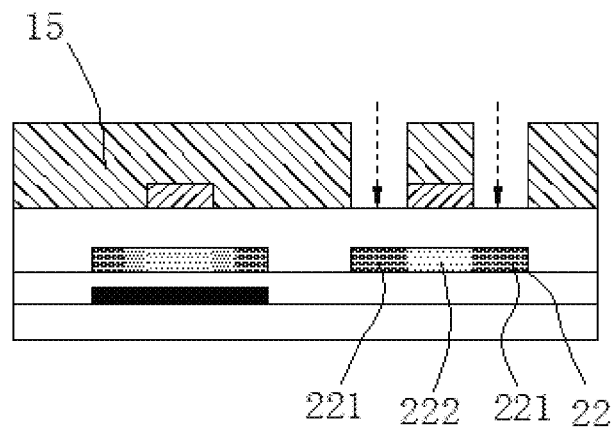

Step S108, as shown in FIG. 9, configuring a positive photoresist mask plate 15, and implementing a P-type heavy doping on two ends of the P-type channel region 22, and forming two P-type heavily doped regions 221 in the P-type channel region 22, and forming a P-type channel 222 between the two P-type heavily doped regions 221 in the P-type channel region 22. The positive photoresist mask plate 15 is stripped after doping is accomplished.

The P-type heavy doping is to implant boron atoms with a high concentration by an ion implantation process.

Figure 10:
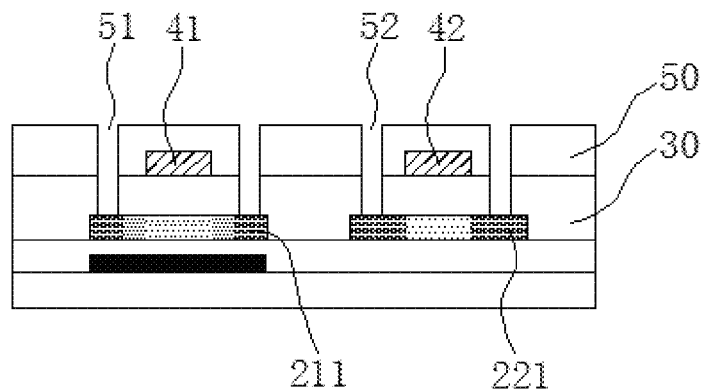

S109, as shown in FIG. 10, preparing an interlayer insulating layer 50 on the gate insulating layer 30, and patterning the interlayer insulating layer 50 and the gate insulating layer 30 to form first vias 51 above the N-type heavily doped region 211 and second vias 52 above the P-type heavily doped regions 221. The interlayer insulating layer 50 covers the first gate electrode 41 and the second gate electrode 42. A material of the interlayer insulating layer 50 is silicon oxide, silicon nitride or a combination of silicon oxide and silicon nitride.

Figure 11:
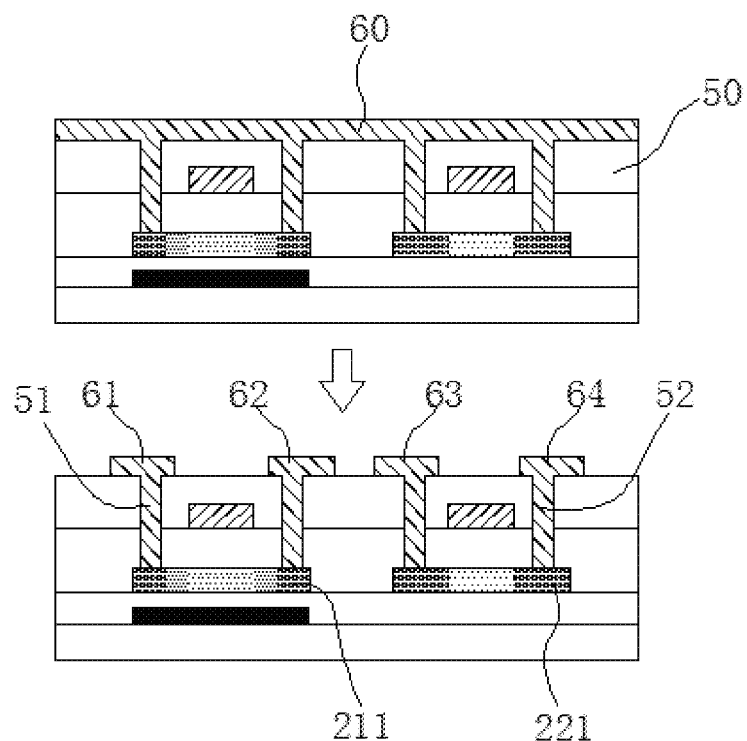

Step S110, as shown in FIG. 11, depositing a second metal layer 60 on the interlayer insulating layer 50, and patterning the second metal layer 60 to form a first source electrode 61 and a first drain electrode 62 in the NMOS region 10*a* and to form a second source electrode 63 and a second drain electrode 64 in the PMOS region 10*b*, wherein the first source electrode 61 and the first drain electrode 62 are respectively connected to the N-type heavily doped region 211 through the first vias 51, and the second source electrode 63 and the second drain electrode 64 are respectively connected to the P-type heavily doped region 221 through the second vias 52.

A material of the second metal layer 60 can be molybdenum (Mo) or titanium (Ti).

In the aforesaid manufacturing method of the complementary metal oxide semiconductor transistor, during the process of implementing the channel doping to the N-type channel region 21, the negative photoresist is utilized and the light shielding pattern 11 below the N-type channel region 21 is used as an exposure mask. Thus, there is no need to specifically design a corresponding exposure mask for the pattern of the N-type channel region and the production cost is saved.

Embodiment 2

Figure 12:
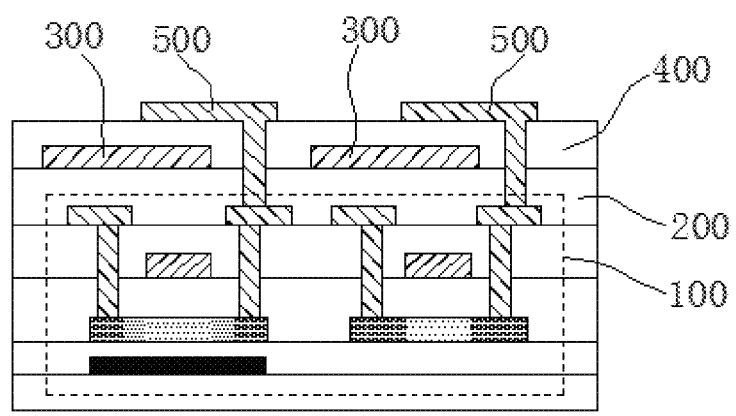
FIG. 12 is a structural diagram of an array substrate prepared according to embodiment 2 of the present invention.

The embodiment provides a manufacturing method of an array substrate. As shown in FIG. 12, the manufacturing method comprises:

first, forming the complementary metal oxide semiconductor transistor 100 on the substrate according to the aforesaid manufacturing method of the complementary metal oxide semiconductor transistor provided by Embodiment 1; then, sequentially preparing a planarization layer 200, a common electrode layer 300, a passivation layer 400 and a pixel electrode layer 500 on the complementary metal oxide semiconductor transistor 100, wherein the pixel electrode layer 500 is electrically coupled to the complementary metal oxide semiconductor transistor 100.

A material of the planarization layer 200 and the passivation layer 400 is silicon oxide, silicon nitride or a combination of silicon oxide and silicon nitride; a material of the common electrode layer 300 and the pixel electrode layer 500 is indium tin oxide.

In conclusion, in the manufacturing method of the complementary metal oxide semiconductor transistor and the manufacturing method of the array substrate provided by the present invention, during the process of implementing the channel doping to the N-type channel region, there is no need to specifically design a corresponding exposure mask for the pattern of the N-type channel region, which saves the production cost in comparison with the prior art.

Incidentally, herein, relational terms such as first and second and the like are only used to distinguish one entity or operation from another entity or operation separate, without necessarily requiring or implying these entities or operations of between the presence of any such actual relationship or order. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A manufacturing method of a complementary metal oxide semiconductor transistor, comprising a step of implementing a channel doping to an N-type channel region, wherein the step comprises:

preparing a low temperature polysilicon layer on a substrate, and patterning the low temperature polysilicon layer to form the N-type channel region correspondingly above a light shielding pattern;

coating a negative photoresist on the substrate, and using the light shielding pattern as a mask to implement exposure to the negative photoresist from a back surface of the substrate to form a negative photoresist mask plate exposing the N-type channel region after development;

implementing the channel doping to the N-type channel region with shielding of the negative photoresist mask plate.

2. The manufacturing method of the complementary metal oxide semiconductor transistor according to claim 1, comprising steps of:

S101, providing the substrate, and defining a NMOS region and a PMOS region on the substrate, and forming the light shielding pattern in the NMOS region on the substrate;

S102, preparing the low temperature polysilicon layer on the substrate, and patterning the low temperature polysilicon layer to form the N-type channel region correspondingly above the light shielding pattern in the NMOS region and to form a P-type channel region in the PMOS region;

S103, implementing the channel doping to the N-type channel region;

S104, implementing an N-type heavy doping on two ends of the N-type channel region, and forming two N-type heavily doped regions in the N-type channel region;

S105, preparing a gate insulating layer on the substrate, wherein the gate insulating layer covers the N-type channel region and the P-type channel region;

S106, depositing a first metal layer on the gate insulating layer, and patterning the first metal layer to form a first gate electrode correspondingly above the N-type channel region and to form a second gate electrode correspondingly above the P-type channel region;

S107, implementing an N-type light doping to the N-type channel region with the first gate electrode as a mask, and forming two N-type lightly doped regions at inner sides of the two N-type heavily doped regions, and forming an N-type channel between the two N-type lightly doped regions in the N-type channel region;

S108, implementing a P-type heavy doping on two ends of the P-type channel region, and forming two P-type heavily doped regions in the P-type channel region, and forming a P-type channel between the two P-type heavily doped regions in the P-type channel region;

S109, preparing an interlayer insulating layer on the gate insulating layer, and patterning the interlayer insulating layer and the gate insulating layer to form first vias above the N-type heavily doped region and second vias above the P-type heavily doped regions;

S110, depositing a second metal layer on the interlayer insulating layer, and patterning the second metal layer to form a first source electrode and a first drain electrode in the NMOS region and to form a second source electrode and a second drain electrode in the PMOS region, wherein the first source electrode and the first drain electrode are respectively connected to the N-type heavily doped region through the first vias, and the second source electrode and the second drain electrode are respectively connected to the P-type heavily doped region through the second vias.

3. The manufacturing method of the complementary metal oxide semiconductor transistor according to claim 2, wherein Step S102, preparing the low temperature polysilicon layer on the substrate comprises:

forming a buffer layer covering the light shielding pattern on the substrate;

depositing an amorphous silicon layer on the buffer layer; and crystallizing the amorphous silicon layer by an excimer laser annealing process to obtain the low temperature polysilicon layer.

4. The manufacturing method of the complementary metal oxide semiconductor transistor according to claim 2, wherein in Step S103, the channel doping is to implement a boron atom light doping to the N-type channel region by an ion implantation process.

5. The manufacturing method of the complementary metal oxide semiconductor transistor according to claim 2, wherein in Step S104, the N-type heavy doping is to implant phosphorous atoms with a high concentration by an ion implantation process.

6. The manufacturing method of the complementary metal oxide semiconductor transistor according to claim 2, wherein in Step S107, the N-type light doping is to implant phosphorous atoms with a low concentration by an ion implantation process.

7. The manufacturing method of the complementary metal oxide semiconductor transistor according to claim 2, wherein in Step S108, the P-type heavy doping is to implant boron atoms with a high concentration by an ion implantation process.

8. The manufacturing method of the complementary metal oxide semiconductor transistor according to claim 2, wherein the substrate is a glass substrate; a material of the light shielding pattern, the first metal layer and the second metal layer is molybdenum or titanium; a material of the gate insulating layer and the interlayer insulating layer is silicon oxide, silicon nitride or a combination of silicon oxide and silicon nitride.

9. A manufacturing method of an array substrate, comprising:
  forming a complementary metal oxide semiconductor transistor on a substrate, and
  sequentially preparing a planarization layer, a common electrode layer, a passivation layer and a pixel electrode layer on the complementary metal oxide semiconductor transistor, wherein the pixel electrode layer is electrically coupled to the complementary metal oxide semiconductor transistor;
  wherein the manufacturing method of the complementary metal oxide semiconductor transistor comprises a step of implementing a channel doping to an N-type channel region, wherein the step comprises:
  preparing a low temperature polysilicon layer on a substrate, and patterning the low temperature polysilicon layer to form the N-type channel region correspondingly above a light shielding pattern;
  coating a negative photoresist on the substrate, and using the light shielding pattern as a mask to implement exposure to the negative photoresist from a back surface of the substrate to form a negative photoresist mask plate exposing the N-type channel region after development;
  implementing the channel doping to the N-type channel region with shielding of the negative photoresist mask plate.

10. The manufacturing method of the array substrate according to claim 9, wherein a material of the planarization layer and the passivation layer is silicon oxide, silicon nitride or a combination of silicon oxide and silicon nitride; a material of the common electrode layer and the pixel electrode layer is indium tin oxide.

11. The manufacturing method of the array substrate according to claim 9, comprising steps of:
  S101, providing the substrate, and defining a NMOS region and a PMOS region on the substrate, and forming the light shielding pattern in the NMOS region on the substrate;
  S102, preparing the low temperature polysilicon layer on the substrate, and patterning the low temperature polysilicon layer to form the N-type channel region correspondingly above the light shielding pattern in the NMOS region and to form a P-type channel region in the PMOS region;
  S103, implementing the channel doping to the N-type channel region;
  S104, implementing an N-type heavy doping on two ends of the N-type channel region, and forming two N-type heavily doped regions in the N-type channel region;
  S105, preparing a gate insulating layer on the substrate, wherein the gate insulating layer covers the N-type channel region and the P-type channel region;
  S106, depositing a first metal layer on the gate insulating layer, and patterning the first metal layer to form a first gate electrode correspondingly above the N-type channel region and to form a second gate electrode correspondingly above the P-type channel region;
  S107, implementing an N-type light doping to the N-type channel region with the first gate electrode as a mask, and forming two N-type lightly doped regions at inner sides of the two N-type heavily doped regions, and forming an N-type channel between the two N-type lightly doped regions in the N-type channel region;
  S108, implementing a P-type heavy doping on two ends of the P-type channel region, and forming two P-type heavily doped regions in the P-type channel region, and forming a P-type channel between the two P-type heavily doped regions in the P-type channel region;
  S109, preparing an interlayer insulating layer on the gate insulating layer, and patterning the interlayer insulating layer and the gate insulating layer to form first vias above the N-type heavily doped region and second vias above the P-type heavily doped regions;
  S110, depositing a second metal layer on the interlayer insulating layer, and patterning the second metal layer to form a first source electrode and a first drain electrode in the NMOS region and to form a second source electrode and a second drain electrode in the PMOS region, wherein the first source electrode and the first drain electrode are respectively connected to the N-type heavily doped region through the first vias, and the second source electrode and the second drain electrode are respectively connected to the P-type heavily doped region through the second vias.

12. The manufacturing method of the array substrate according to claim 11, wherein Step S102, preparing the low temperature polysilicon layer on the substrate comprises:
  forming a buffer layer covering the light shielding pattern on the substrate;
  depositing an amorphous silicon layer on the buffer layer; and
  crystallizing the amorphous silicon layer by an excimer laser annealing process to obtain the low temperature polysilicon layer.

13. The manufacturing method of the array substrate according to claim 11, wherein in Step S103, the channel doping is to implement a boron atom light doping to the N-type channel region by an ion implantation process.

14. The manufacturing method of the array substrate according to claim 11, wherein in Step S104, the N-type heavy doping is to implant phosphorous atoms with a high concentration by an ion implantation process.

15. The manufacturing method of the array substrate according to claim 11, wherein in Step S107, the N-type light doping is to implant phosphorous atoms with a low concentration by an ion implantation process.

16. The manufacturing method of the array substrate according to claim 11, wherein in Step S108, the P-type heavy doping is to implant boron atoms with a high concentration by an ion implantation process.

17. The manufacturing method of the array substrate according to claim 11, wherein the substrate is a glass substrate; a material of the light shielding pattern, the first metal layer and the second metal layer is molybdenum or titanium; a material of the gate insulating layer and the interlayer insulating layer is silicon oxide, silicon nitride or a combination of silicon oxide and silicon nitride.

\* \* \* \* \*